(12) United States Patent
Chen et al.

(10) Patent No.: US 11,876,146 B2
(45) Date of Patent: Jan. 16, 2024

(54) PHOTOVOLTAIC (PV) MODULE AND METHOD FOR FABRICATING THE SAME, AND SOLAR CELL MODULE AND SOLAR CELL STRING

(71) Applicant: SUZHOU XIAONIU AUTOMATION EQUIPMENT CO., LTD, Suzhou (CN)

(72) Inventors: Shigeng Chen, Suzhou (CN); Yonggang Wu, Suzhou (CN); Yong Yang, Suzhou (CN); Qifei Ge, Suzhou (CN); Zhuozhen Han, Suzhou (CN)

(73) Assignee: SUZHOU XIAONIU AUTOMATION EQUIPMENT CO., LTD, Suzhou (CN)

( * ) Notice: Subject to any disclaimer, the term of this patent is extended or adjusted under 35 U.S.C. 154(b) by 0 days.

(21) Appl. No.: 18/333,238

(22) Filed: Jun. 12, 2023

(65) Prior Publication Data

US 2023/0327046 A1    Oct. 12, 2023

Related U.S. Application Data

(63) Continuation of application No. PCT/CN2023/088158, filed on Apr. 13, 2023.

(30) Foreign Application Priority Data

Aug. 30, 2022  (CN) .......................... 202211044155.6

(51) Int. Cl.
*H01L 31/18* (2006.01)
*H01L 31/048* (2014.01)
*H01L 31/05* (2014.01)

(52) U.S. Cl.
CPC ...... *H01L 31/1876* (2013.01); *H01L 31/0481* (2013.01); *H01L 31/0512* (2013.01); *H01L 31/0516* (2013.01); *H01L 31/1804* (2013.01)

(58) Field of Classification Search
CPC ... H01L 31/048; H01L 31/0481; H01L 31/05; H01L 31/0512; H01L 31/0516; H01L 31/18; H01L 31/1804; H01L 31/1876
See application file for complete search history.

(56) References Cited

U.S. PATENT DOCUMENTS

| 2008/0185033 A1* | 8/2008 | Kalejs ................... H01L 31/056 136/246 |
| 2009/0078250 A1* | 3/2009 | Ishii .................. B32B 17/10788 126/704 |

FOREIGN PATENT DOCUMENTS

| CN | 112289889 A | * | 1/2021 | ......... H01L 31/0504 |
| CN | 113659031 A | | 11/2021 | |

(Continued)

*Primary Examiner* — Mayla Gonzalez Ramos (57) ABSTRACT

A method for fabricating a photovoltaic (PV) module, including: (1) covering a polymer material on the side of the crystalline silicon solar cell attached with a solder ribbon followed by heating to allow bonding of the solder ribbon to the crystalline silicon solar cell, so as to obtain a solar cell module; (2) assembling several solar cell modules into a solar cell string, and connecting multiple solar cell strings to form a solar cell array; (3) laying sealing plates respectively on the front and back sides of the solar cell array to form a stacked body; and (4) subjecting the stacked body to lamination achieve an ohmic contact between the solder ribbon and the grid line, and transformation of the polymer material into a filler layer. This application further provides a PV module fabricated by such method, a solar cell module and a solar cell string.

6 Claims, 3 Drawing Sheets

(56) References Cited

FOREIGN PATENT DOCUMENTS

| | | | | |
|---|---|---|---|---|
| CN | 114068734 A | 2/2022 | | |
| CN | 114068735 A | 2/2022 | | |
| CN | 114744080 A | 7/2022 | | |
| CN | 115117206 A | 9/2022 | | |
| JP | 2014060278 A * | 4/2014 | | |
| WO | WO-2012086590 A1 * | 6/2012 | ........... | H01L 31/048 |
| WO | WO-2017134784 A1 * | 8/2017 | ........... | H01L 31/048 |

* cited by examiner

PHOTOVOLTAIC (PV) MODULE AND METHOD FOR FABRICATING THE SAME, AND SOLAR CELL MODULE AND SOLAR CELL STRING

CROSS-REFERENCE TO RELATED APPLICATIONS

This application is a continuation of International Patent Application No. PCT/CN2023/088158, filed on Apr. 13, 2023, which claims the benefit of priority from Chinese Patent Application No. 202211044155.6, filed on Aug. 30, 2022. The content of the aforementioned application, including any intervening amendments thereto, is incorporated herein by reference in its entirety.

TECHNICAL FIELD

This application relates to solar cells, and more particularly to a photovoltaic (PV) module and a method for fabricating the same, and a solar cell module and a solar cell string.

BACKGROUND

Currently, the production process for a photovoltaic (PV) module mainly includes soldering and lamination. The soldering refers to the process of connecting individual solar cells (e.g., crystalline silicon solar cells) in series through solder ribbons (e.g., interconnect ribbons) to increase the overall output voltage of the module. The solar cell strings formed by soldering are further connected in series and parallel to form solar cell arrays, which are then subject to laminated packaging to form the PV module.

In the manufacturing of the series-connected solar cell string, the solder ribbon is bonded to the solar cells with a film (namely, flexible connection between the solder ribbon and the solar cell). Compared with the conventional thermal soldering, such flexible bonding method is closer to a stress-free connection. Therefore, it can avoid the cracks and hidden cracks of the solar cells. Nevertheless, the existing films are formed by laminating or bonding two or more layers of different polymers, where the innermost layer in direct contact with the solder ribbon and the solar cell has a higher adhesion and the outermost layer has a lower or no adhesion. Hence, in the actual production process, it is necessary to distinguish the front and back sides of the film, and make the side with a higher adhesion in contact with the solar cell, rendering the process more complex. Furthermore, the film formed by two or more layers of polymer materials often has high manufacturing and use costs, resulting in a higher overall manufacturing cost for the PV modules.

In view of this, it is urgently needed to develop a new strategy to enable the strong and stable bonding between the solder ribbon and the solar cell with low cost and easy operation to improve the production efficiency of the PV modules.

SUMMARY

An object of the present disclosure is to provide a photovoltaic (PV) module and a method for fabricating the same, a solar cell module, and a solar cell string to overcome the aforementioned deficiencies. In this application, a single layer of an isotropic polymer material is used as the bonding film to cover the side of the crystalline silicon solar cell where the solder ribbon is attached, followed by heating to allow the bonding of the solder ribbon to the crystalline silicon solar cell to obtain a solar cell module. Several solar cell modules are assembled into a solar cell array followed by lamination to achieve an ohmic contact between the solder ribbon and the grid line. Meanwhile, the polymer material is transformed into a filler layer, and the front and back sides of the solar cell array are packaged to obtain the PV module. Compared with the prior art, a thin polymer layer is used herein to complete the bonding of the solder ribbon and the packaging of the PV module, which ensures the stable bonding without affecting the electrical connection performance between the solder ribbon and the crystalline silicon solar cell. Moreover, there is no need to distinguish the front and back sides of the film. Therefore, the method provided herein has simplified process, lowered material consumption, and reduced costs, and will not affect the overall light transmission of the PV module.

Technical solutions of the present disclosure are described as follows.

In a first aspect, this application provides method for fabricating a photovoltaic (PV) module, comprising:

(S1) placing a solder ribbon on at least one side of a crystalline silicon solar cell; covering a first polymer material on the at least side of the crystalline silicon solar cell where the solder ribbon is placed, followed by heating at a first temperature to bond the polymer material to the crystalline silicon solar cell, so as to attach the solder ribbon to the crystalline silicon solar cell to form a solar cell module; and successively or simultaneously preparing a plurality of solar cell modules, and connecting the plurality of solar cell modules in series by the solder ribbon to form a solar cell string; connecting a plurality of solar cell strings in series and/or in parallel through a busbar to form a solar cell array;

wherein the first polymer material is an isotropic homogeneous film composed of a single substance;

(S2) laying a first sealing plate on a first side of the solar cell array, and laying a second sealing plate on a second side of the solar cell array to form a stacked body;

(S3) subjecting the stacked body obtained in step (S2) to lamination at a second temperature to enable a soldering layer of the solder ribbon to be melted and soldered with a grid line of the crystalline silicon solar cell to form an ohmic contact, and allow softening of the first polymer material and the second polymer material to form a filler layer to package the solar cell array, thereby producing the PV module.

In the prior art, the film used in the bonding process consists of two layers of different materials, where the lower layer in contact with the solder ribbon has a larger viscosity than the upper layer. Therefore, an adhesive layer needs to be provided on the upper layer for encapsulation prior to the subsequent lamination process. In contrast, the method provided herein requires only one layer of polymer material to complete the bonding of the solder ribbon to the crystalline silicon solar cell and the subsequent encapsulation of the sealing plate. The polymer material is an isotropic homogeneous film composed of a single substance, that is, the physical properties of the polymer material, such as viscosity and fluidity, do not change with the size and position within the film. Besides, the film used herein has the same adhesive properties on both sides. Compared with the prior art, the thickness of the film is effectively reduced, and thus the costs are lowered. Moreover, the film can be used without distinguishing the front and back sides, simplifying the process and reducing the error rate. It also ensures that the filler layer transformed by the single polymeric material has a high degree of homogeneity and permeability after the lamination process, which facilitates the optical gain of the module.

The method provided herein does not require the soldering of the solder ribbon to the crystalline silicon solar cell, but rather simply placing the solder ribbon on the grid line of the surface of the crystalline silicon solar cell. Then a polymer material is used to cover the surface of the crystalline silicon solar cell, and is heated to simultaneously cover both the solder ribbon and the crystalline silicon solar cell, thus enabling an effective and firm bonding of the solder ribbon to the crystalline silicon solar cell, thereby providing a basis for the formation of the filler layer by the polymeric material in the subsequent lamination process. The lamination process involves heating and applying pressure. During the lamination process, the soldering layer on the surface of the solder ribbon is melted and forms a metallic connection with the grid line, while the polymer material is cross-linked by heat and pressure to render an increased fluidity for filling gaps in the solar cell array. Besides, since the solder ribbon is already pre-bonded and fixed on the solar cell, it will not move during the lamination process, but rather firmly attaching to the grid line when applying pressure. Hence, the melted soldering layer of the solder ribbon can form a good ohmic contact with the grid line, and the polymer material does not easy to overflow and enter the space between the solder ribbon and the crystalline silicon solar cell, thus avoiding the electrical insulation problems of the solder ribbon caused by poor contact between the solder ribbon and the crystalline silicon solar cell due to the overflow polymer material.

It is to be noted that, since the polymer material used herein is an isotropic homogeneous material with the same adhesion on both sides, it is preferred to perform multi-point mechanical gripping of the polymer material in actual production to achieve gripping and automated production of the solar cell module, the solar cell string and the solar cell arrays. Specifically, the multi-point mechanical gripping is performed by means of a robot equipped with an anti-adhesive coating. The area of each contact point is less than or equal to 5% of the total area of the gripping surface of the gripping object. The total contact area is greater than or equal to 85% of the total area of the gripping surface of the gripping object. The anti-adhesive coating is any one or a combination of at least two of amorphous fluoropolymer (AF), fluorinated ethylene propylene (FEP) resin, fluoroplastic foam resin (FFR), polyfluoroalkoxy resin (PFA), Polytetrafluoroethylene (PTEE) and a ceramic coating. By cooperation of the multi-point contact and the anti-adhesive layer, the adhesion of the gripping surface of the polymer material to the mechanical gripper can be better avoid.

It is also to be noted that the specific sequence of the processes for making the solar cell string using the solar cell modules can be adjusted according to the actual situation. Specifically, in some embodiments, a plurality of individual solar cell modules can be prepared in advance and then are connected in series with a solder ribbon to obtain the solar cell string. In some embodiments, the sequentially arranged crystalline silicon solar cells are directly connected in series with a solder ribbon, followed by arrangement of the polymer material on the surface of the crystalline silicon solar cells and heating at the first temperature to give the solar cell string.

In an embodiment, a softening point of the first polymer material and the second polymer material is no more than the first temperature; the first temperature is less than a melting point of the soldering layer of the solder ribbon, and the melting point of the soldering layer of the solder ribbon is less than or equal to the second temperature.

When the softening point of the polymer material is less than the first temperature, the heating at the first temperature renders the polymer material a thermal adhesion, which ensures that the polymer material can be bonded to the crystalline silicon solar cell and hold the solder ribbon in place. When the heating is complete, the polymer material gradually cools, and returns to its original degree of cross-linking degree followed by curing to firmly lock the solder ribbon firmly in the position corresponding to the grid line. As the lamination requires the polymer material to be more flowable, the melting point of the polymer material is preferably less than or equal to the second temperature allowing for a good quality of the filler layer formed by the lamination.

In an embodiment, in step (S1), the first temperature is 70-130° C. excluding 130° C., such as 70° C., 75° C., 80° C., 85° C., 90° C., 95° C., 100° C., 105° C., 110° C., 115° C., 120° C., 125° C., and 129° C. In step (S3), the second temperature is 130-170° C., such as 130° C., 135° C., 140° C., 145° C., 150° C., 155° C., 160° C., 165° C., or 170° C. Notably, the first temperature and the second temperature are not limited to the listed values, other values not listed above are also applicable.

To ensure that the polymer material can wrap the solder ribbon around the surface of the crystalline silicon solar cell and achieve a good bonding without further damaging the contact condition between the solder ribbon and the crystalline silicon solar cell, the polymer material is limited for bonding at low temperatures herein. Specifically, the heating at a first temperature in step (S1) is preferably performed at a low temperature. In this case, the polymer material has a very low liquidity and does not able to enter the gap between the solder ribbon and the crystalline silicon solar cell, but can well wrap the surface of the solder ribbon and the crystalline silicon solar cell, resulting in a firm bonding of the solder ribbon. The first temperature is preferably 70 to 130° C. excluding 130° C. Accordingly, the solder ribbon is a low-temperature solder ribbon, of which the melting point of the soldering layer is 130-170° C., so that the soldering layer of the low-temperature solder ribbon is not melted at the first temperature, but is melted at the second temperature in step (S3) to form a metallized connection with the corresponding grid wire. Accordingly, the polymer material produces a certain thermal adhesion only at the first temperature for effective bonding and fixing of the solder ribbon, and gains a good fluidity after being melted at the second temperature to fill the gaps in the solar cell array.

The soldering layer of the above-mentioned low-temperature solder ribbon can be formed by an alloy of tin, lead, silver, bismuth, antimony and gallium, which is low-cost. In some embodiments, the low-temperature solder ribbon can also be formed by a tin-lead-indium-based soldering alloy, where the tin-lead-indium-based soldering alloy comprises at least tin, lead, indium and gallium, and is costly but having a lower melting point temperature. One of ordinary skill in the art can select a proper low-temperature solder ribbon according to the actual situation and needs as long as the melting point of the soldering layer of the selected low-temperature soldering ribbon is 130-170° C.

In an embodiment, the heating at the first temperature in step (1) is performed for 1-5 s, such as, 1 s, 1.2 s, 1.4 s, 1.6 s, 1.8 s, 2 s, 2.2 s, 2.4 s, 2.6 s, 2.8 s, 3 s, 3.2 s, 3.4 s, 3.6 s, 3.8 s, 4 s, 4.2 s, 4.4 s, 4.6 s, 4.8 s and 5 s. Notably, the heating time is not limited to the values listed, and other values within the above range are also applicable.

In an embodiment, the step (S1) further comprises:
during the heating at the first temperature, applying a force towards the crystalline silicon solar cell to the first polymer material; and
after the heating, cooling the first polymer material by air blowing to complete bonding between the first polymer material and the crystalline silicon solar cell.

It should be noted that the higher the first temperature in step (S1), the shorter the heating time should be, to prevent the degree of cross-linking and fluidity of the polymer material from changing too much. After the heating is completed, the polymer material must be cooled immediately, preferably by blowing cooling to make the polymer material quickly return to its original state, so as to achieve rapid fixation of the solder ribbon, thereby avoiding the movement of the solder ribbon due to weak bonding caused by slow cooling. At the same time, the rapid cooling also facilitates the smooth running of the gripping process of the solar cell module and ensures a stable and continuous production and assembly of the solar cell string and the solar cell array.

In an embodiment, a thickness of the first polymer material located on a side of the solar cell module in step (S1) is 0.02-0.6 mm, such as 0.02 mm, 0.03 mm, 0.04 mm, 0.05 mm, 0.06 mm, 0.07 mm, 0.08 mm, 0.09 mm, 0.1 mm, 0.15 mm, 0.2 mm, 0.25 mm, 0.3 mm, 0.35 mm, 0.4 mm, 0.45 mm, 0.5 mm, 0.55 mm, and 0.6 mm, but not limited to those listed values, and other values not listed above are also applicable.

When the polymer material is thicker in the preferred range, the wrapping effect to the solder ribbon is increased, and the bonding of the solder ribbon to the crystalline silicon solar cell is enhanced. At the same time, the thicker polymer material can better fill the area other than the connection portion of the solder ribbon and the solar cell during the lamination process.

In an embodiment, the step (S1) further comprises:
introducing a second polymer material to fill gaps in the solar cell array.

In an embodiment, the second polymer material is introduced into the solar cell array through a step of
filling the gaps in the solar cell array with the second polymer material in a ribbon shape, a block shape, or a net shape; and/or
covering an outer surface of the solar cell array with a piece of the second polymer material.

After the supplementary of the polymer material, the total thickness of the first polymer material and the second polymer material in step (S1) is 0.15-0.6 mm, preferable, 0.40-0.6 mm, such as, 0.15 mm, 0.20 mm, 0.25 mm, 0.30 mm, 0.35 mm, 0.38 mm, 0.4 mm, 0.42 mm, 0.44 mm, 0.46 mm, 0.48 mm, 0.5 mm, 0.52 mm, 0.54 mm, 0.56 mm, 0.58 mm and 0.6 mm, but are not limited to the listed values, and other values not listed in the above range are also applicable.

In the solar cell string formed by several solar cell modules and the solar cell array formed by several solar cell string in step (S1), one or each of two sides of each crystalline silicon solar cell attached with a solder ribbon is covered with a first polymer material. And at the same time, the connection portion of the solder ribbon and/or the busbar, the gaps between the adjacent solar cell modules are preferably supplemented with a second polymer material to allow for a more homogeneous and complete filler layer formed by the cross-linking and fusion of the polymer material during the subsequent lamination process, and the filler layer is free of excess pores and air bubbles. The second polymer material is preferably in the form of strip, block, and net to fill the gaps and has a thickness similar to the first polymer material, so as to form a single layer as a whole, thus saving material and reducing costs. In some embodiments, the second polymer material is laid on top of the first polymer material to form a new polymer layer. Importantly, in any way, the total thickness of the first polymer material and the second polymer material on the same side should be limited, preferably to a total thickness of 0.4-0.6 mm. In such cases, the final filler layer is uniform and complete without being too thick and causing unnecessary losses. The above polymer materials are all isotropic films made of a single substance. The first polymer material is the same as the second polymer material.

In an embodiment, the polymer material specified in step (S1) is selected from the group consisting of polyvinyl butyral (PVB), ethylene vinyl acetate (EVA), polyolefin elastomer (POE), polyformaldehyde (POM), polyvinylidene (PVD), thermoplastic polyolefin (TPO), thermoplastic polyurethane (TPU) and polyamide (PA); wherein PVB refers to polyvinyl butyral ester, EVA refers to ethylene vinyl acetate copolymer, POE refers to polyolefin elastomer, POM refers to polyformaldehyde resin, PVD refers to polyvinylidene chloride, TPO refers to thermoplastic polyolefin, TPU refers to thermoplastic polyurethane elastomer, and PA refers to polyamide.

In an embodiment, the polymer material used herein is a thermoplastic resin material, such as a PVB adhesive film formed by PVB and plasticizers. The PVB adhesive film has the characteristics of recyclable, secondary processing, and reusable. Moreover, it can maintain its original form and will not undergo body shrinkage within the temperature interval for bonding defined herein and under the action of a certain pressure. Therefore, it can prevent the solder ribbon from moving due to the film shrinking caused by during the preparation of the solar cell string and the PV module.

In an embodiment, step (S3) further comprises the assembly of the solar cell modules.

In an embodiment, the assembly comprises the installation of a frame and a junction box.

In an embodiment, the front sealing plate and the back sealing plate in step (2) are both made of glass and/or polymers.

In a second aspect, this application provides a solar cell module fabricated by using the aforementioned method.

In a third aspect, this application provides a solar cell string fabricated by using the aforementioned method.

In a fourth aspect, this application further provides a PV module fabricated by using the aforementioned method Compared to the prior art, the present disclosure has the following beneficial effects.

(1) Regarding the fabrication method provided herein, a single layer of a homogeneous isotropic polymer material is used as the bonding film, effectively reducing the thickness, and lowering the production costs. Moreover, it is not required to distinguish the front and back sides of the bonding film when used, which achieves the efficient and stable bonding between the solder ribbon and the crystalline silicon solar cell with lowered cost and simplified process, and avoids errors in the bonding process.

(2) The method provided herein does not require the soldering of the solder ribbon to the crystalline silicon solar cell, but directly utilizes a polymer layer to complete the bonding of the solder ribbon at a low temperature prior to the lamination process. In this case, the firm bonding between the solder ribbon and the crystalline silicon solar cell can be ensured, and the insulation problem caused by the polymer material entering the space between the solder ribbon and the crystalline silicon solar cell is avoided. Besides, since the same polymer material is used for both bonding and laminating, the filler layer formed by the polymer material has high homogeneity and transparency, which facilitates improving the optical gain of the PV module.

In the drawings: 1, crystalline silicon solar cell; 2, solder ribbon; 3, polymer material; 4, filler layer; 5, front sealing plate; and 6, back sealing plate.

DETAILED DESCRIPTION OF EMBODIMENTS

The technical solutions of the present disclosure will be further described below with reference to the accompanying drawings and embodiments. Obviously, the described embodiments are only for promoting the understanding of the present disclosure and should not be considered as specific limitations to the present disclosure.

The front side of the solar cell module, the solar cell string, the solar cell array and the photovoltaic (PV) module described below refers to the light-receiving side (light-facing side), and the reverse side or back side refers to the side opposite to the front side.

The solder ribbons used in the following embodiments and the comparative embodiments are the same. The melting point of the soldering layer of the solder ribbon is 138-169° C., and the substrate of the solder ribbon has a copper content of more than or equal to 99.96%. Such solder ribbon has the following advantages: suitable for the low-temperature soldering process of the solar cells; reducing the risk of hidden cracking of the solar cells; more suitable for thin and large-size silicon wafers; and reducing the loss of the PV module.

Embodiment 1

Provided is a method for preparing a PV module, which is applied to a solar cell with a positive electrode located on a front side of a crystalline silicon solar cell and a negative electrode located on a back side of the crystalline silicon solar cell. The method includes the following steps.

Step (1) Bonding Process

A solder ribbon is successively laid on two primary grid lines on a back side of a crystalline silicon solar cell and two primary grid lines on a front side of an adjacent crystalline silicon solar cell to enable the series connection between two adjacent crystalline silicon solar cells, and in this way, 15 crystalline silicon solar cells are sequentially connected in series. Then the front and back sides of each crystalline silicon solar cell are each covered with an isotropic homogeneous polyvinylbutyral (PVB) film having a thickness of 0.5 mm. A heating device is allowed to be in direct contact with the PVB film and heat the PVB film at 70° C. for 3 s, so as to obtain a solar cell string formed by 15 solar cell modules connected in series. Four solar cell strings are prepared and connected in parallel via busbars to form a solar cell array.

Step (2) Stacking Process

A front glass sheet is laid on a front side of the solar cell array, and a back polymer sheet is laid on a back side of the solar cell array, so as to form a stacked body.

Step (3) Lamination Process

The stacked body obtained in step (2) is subjected to lamination in a double-sided heating laminator at 160° C. for 360 s. The tin layer of the solder ribbon is melted and forms a metallized connection with the grid line to form an ohmic contact. A front filler layer and a back filler layer are respectively formed on front and back sides of the stacked body, so as to complete the packaging of the front glass sheet and the back polymer sheet to obtain the PV module. A frame is arranged around the perimeter of the PV module, and a junction box is arranged on the back polymer sheet, so as to arrive at the final product.

Figure 1:
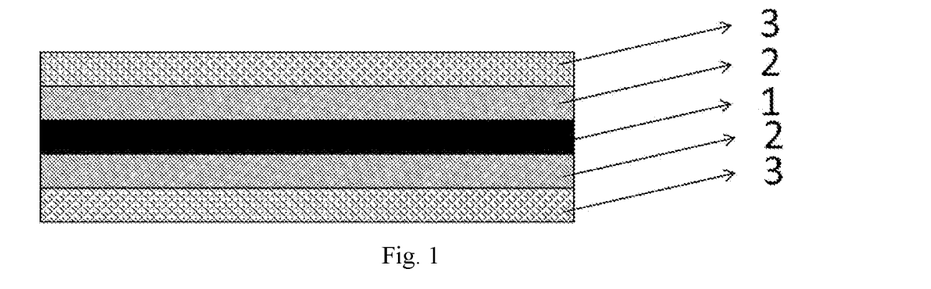
FIG. 1 is a schematic diagram of a solar cell module obtained in step (S1) according to Embodiment 1 of the present disclosure along a width direction of a solder ribbon.
Figure 2:
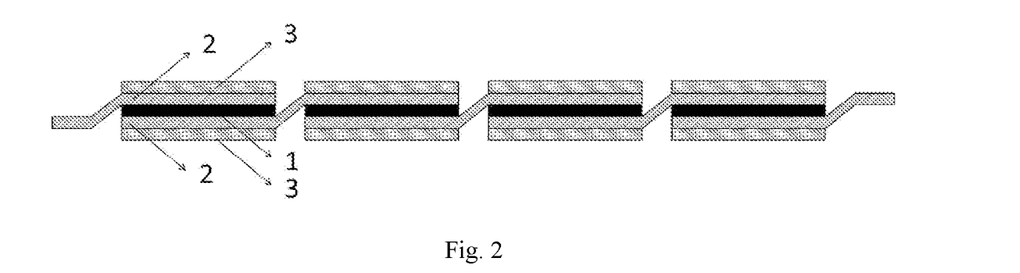
FIG. 2 is a schematic diagram of a solar cell string obtained in step (S1) according to Embodiment 1 of the present disclosure.

FIG. 1 is a schematic diagram of the solar cell module obtained in step (1) of this embodiment. FIG. 2 is a schematic diagram of the solar cell string obtained in step (1) of this embodiment. The solder ribbon 2 is placed on the front and back sides of the crystalline silicon solar cell 1 in the solar cell module. The outer surface of the crystalline silicon solar cell 1 is covered with a polymer material 3 to enable the solder ribbon 2 to be firmly bonded to the crystalline silicon solar cell 1. The solar cell string includes 15 solar cell modules sequentially arranged in a straight line (only four solar cell modules are shown in FIG. 2). The solder ribbon 2 on the back side of the former solar cell module is connected to the solder ribbon 2 on the front side of the latter solar cell module, so as to enable the series connection of individual solar cell modules.

Figure 3:
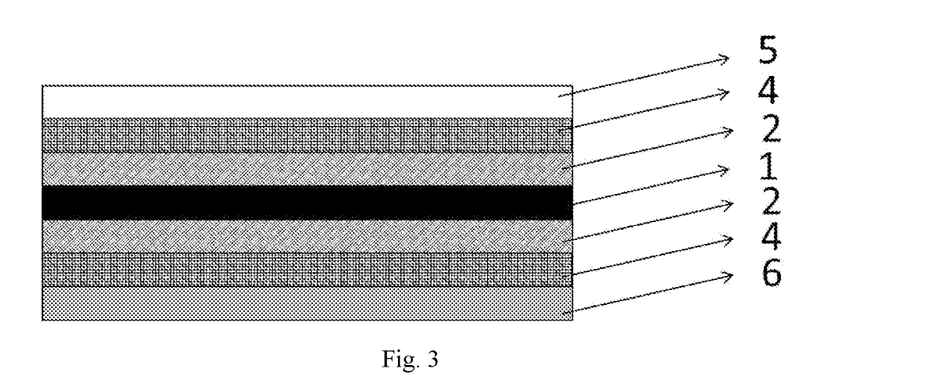
FIG. 3 is a schematic diagram of a solar cell module in a PV module obtained in step (S3) according to Embodiment 1 of the present disclosure along a width direction of a solder ribbon.

FIG. 3 is a schematic diagram of a structure of a solar cell module of the PV module obtained in step (3) of this embodiment. As can be seen from FIG. 3, after the lamination process, the solar cell module includes a crystalline silicon solar cell 1. The front and back sides of the crystalline silicon solar cell 1 are each provided with the solder ribbon 2. The front and back side outer surfaces of the crystalline silicon solar cell 1 are each provided with the filler layer 4 formed by the polymer material 3. The exposed solder ribbon 2 and the crystalline silicon solar cell 1 are covered with the filler layer 4. The filler layer 4 on the front side of the crystalline silicon solar cell 1 is covered with a front sealing plate 5 made of glass, and the filler layer 4 on the back side of the crystalline silicon solar cell 1 is covered with a back sealing plate 6 made of a polymer material.

Embodiment 2

Provided is a method for preparing a PV module, which is applied to a back contact solar cell whose positive and negative electrodes are both located on a back side of the crystalline silicon solar cell. The method includes the following steps.

Step (1) Bonding Process

A solder ribbon is successively laid on a negative electrode grid line on a back side of a crystalline silicon solar cell and a positive electrode grid line on a back side of an adjacent crystalline silicon solar cell to enable the series connection between two adjacent crystalline silicon solar cells, and in this way, 10 crystalline silicon solar cells are sequentially connected in series in. Then the back side of each crystalline silicon solar cell is covered with an isotropic homogeneous PVB film having a thickness of 0.38 mm. A heating device is allowed to be in direct contact with the PVB film and heat the PVB film at 128° C. for 1s, so as to obtain a solar cell string formed by 10 solar cell modules connected in series. Four solar cell strings are prepared and connected in parallel via busbars to form a solar cell array. Front and back sides of the solar cell array are each covered with an isotropic homogeneous PVB film having a thickness of 0.2 mm.

Step (2) Stacking Process

A front glass sheet is laid on a front side of the solar cell array, and a back polymer sheet is laid on a back side of the solar cell array, so as to form a stacked body.

Step (3) Lamination Process

The stacked body obtained in step (2) is subjected to lamination in a single-sided heating laminator at 140° C. for 900 s. The tin layer of the solder ribbon is melted and metallized with the grid line to form an ohmic contact. A front filler layer and a back filler layer are respectively formed on front and back sides of the stacked body, so as to complete the packaging of the front glass sheet and the back polymer sheet to obtain the PV module. A frame is arranged around the perimeter of the PV module, and a junction box is arranged on the back polymer sheet, so as to arrive at the final product.

The single-sided heating laminator used in step (3) of this embodiment is different from the double-sided heating laminator used in step (3) of Embodiment 1 on the speed of thermal conduction and the heating time.

Figure 4:
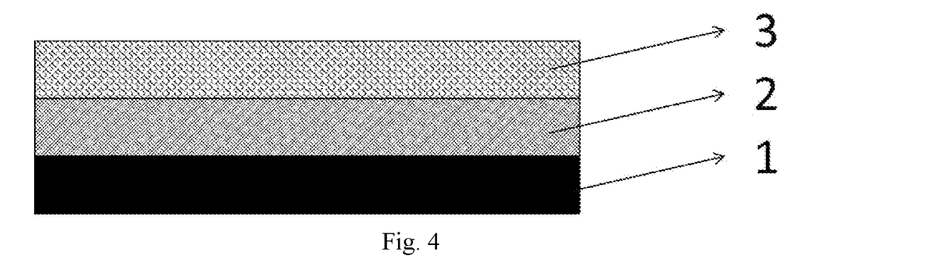
FIG. 4 is a schematic diagram of a solar cell module obtained in step (S1) according to Embodiment 2 of the present disclosure along a width direction of a solder ribbon.
Figure 5:
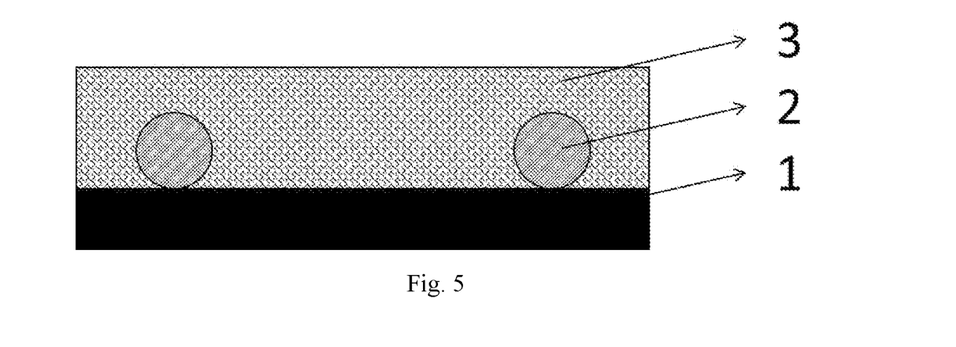
FIG. 5 is a schematic diagram of the solar cell module obtained in step (S1) according to Embodiment 2 of the present disclosure along a length direction of the solder ribbon.
Figure 6:
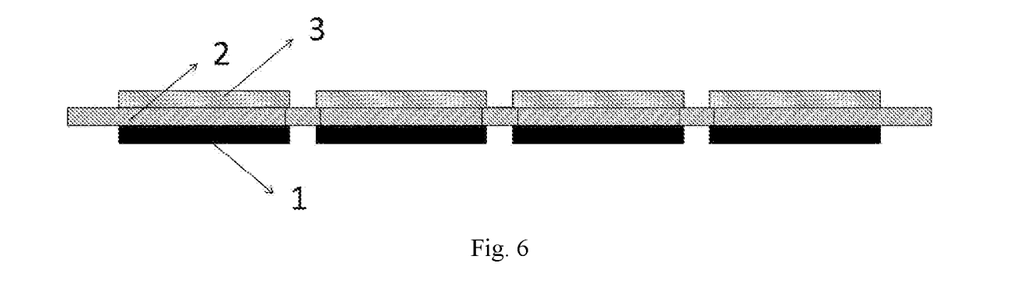
FIG. 6 is a schematic diagram of a solar cell string obtained in step (S1) according to Embodiment 2 of the present disclosure.

FIGS. 4 and 5 are schematic diagrams of a structure of the solar cell module obtained in step (1) of this embodiment. FIG. 6 is a schematic diagram of a structure of the solar cell string obtained in step (1) of this embodiment. The solder ribbon 2 is placed on the back side of the crystalline silicon solar cell 1 in the solar cell module. The outer surface of the crystalline silicon solar cell 1 is covered with a polymer material 3 to enable the solder ribbon 2 to be firmly bonded to the crystalline silicon solar cell 1. The solar cell string includes 10 solar cell modules sequentially arranged in a straight line and spaced apart (only four solar cell modules are shown in FIG. 6). The positive electrode grid line of the former solar cell module is connected to the negative electrode grid line of the latter solar cell module through the solder ribbon 2, so as to enable the series connection of individual solar cell modules.

Figure 7:
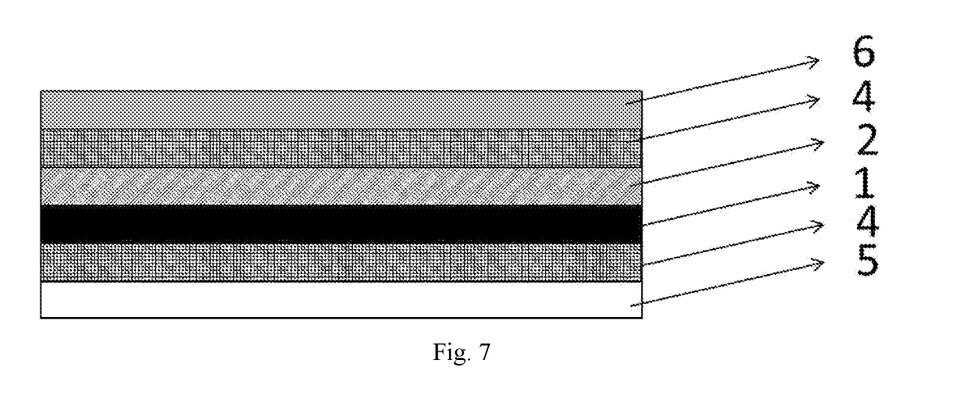
FIG. 7 is a schematic diagram of a solar cell module in a PV module obtained in step (S3) according to Embodiment 3 of the present disclosure along a width direction of the solder ribbon.

FIG. 7 is a schematic diagram of a structure of a solar cell module of the PV module obtained in step (3) of this embodiment. As can be seen from FIG. 7, after the lamination process, the solar cell module includes a crystalline silicon solar cell 1. The back side of the crystalline silicon solar cell 1 is provided with the solder ribbon 2. The front and back side outer surfaces of the crystalline silicon solar cell 1 are each provided with the filler layer 4 formed by the polymer material 3. The filler layer 4 on the front side of the crystalline silicon solar cell 1 is covered with a front sealing plate 5 made of glass. The exposed solder ribbon 2 and the crystalline silicon solar cell 1 are covered with the filler layer 4, and the filler layer 4 on the back side of the crystalline silicon solar cell 1 is covered with a back sealing plate 6 made of a polymer material.

Embodiment 3

Provided is a method for preparing a PV module, which is applied to a back contact solar cell whose positive and negative electrodes are both located on a back side of the crystalline silicon solar cell. The method includes the following steps.

Step (1) Bonding Process

Figure 8:
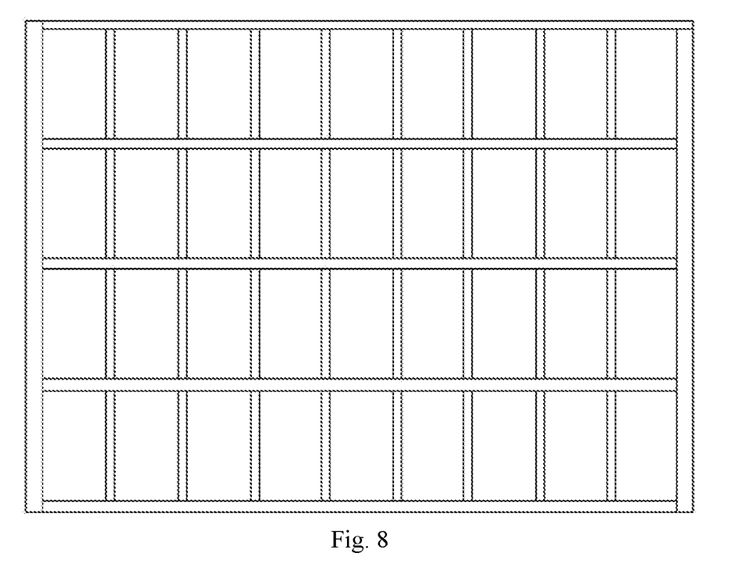
FIG. 8 schematically shows a polyvinyl butyral (PVB) strip introduced to the solar cell array in step (S1) according to Embodiment 3 of the present disclosure.

A solder ribbon is successively laid on a negative electrode grid line and a positive electrode grid line on a back side of a crystalline silicon solar cell. The back side of the crystalline silicon solar cell is covered with an isotropic homogeneous polyvinylidene (PVD) film having a thickness of 0.38 mm. The PVD film is heated with an infrared lamp in a non-contact long-distance manner at a heating power of 150 W and a heating temperature of about 120° C., where the infrared lamp is 20 mm away from the PVD film. During the heating process, the PVD film and the crystalline silicon solar cell are subjected to hot pressing for 1.5 s to obtain a solar cell module. In this way, 12 solar cell modules are sequentially prepared and arranged in a straight line. The positive electrode grid line of the former solar cell module is connected to the negative electrode grid line of the latter solar cell module through a solder ribbon. In this way, the 12 solar cell modules are connected in series to form a solar cell string. Six solar cell strings are prepared and connected in parallel via busbars to form a solar cell array. The back side of the solar cell array is covered with an isotropic homogeneous PVB film having a thickness of 0.02 mm to cover the exposed solder ribbon and busbars and fill the gaps between the solar cell modules, as shown in FIG. 8. After that, the front and back sides of the solar cell array are each covered with an isotropic homogeneous PVB film having a thickness of 0.4 mm. In some embodiments, the homogeneous PVB film may be have a thickness of 0.13 mm, 0.15 mm, 0.20 mm, or 0.30 mm.

Step (2) Stacking Process

A front glass sheet is laid on the front side of the solar cell array, and a back polymer sheet is laid on the back side of the solar cell array, so as to form a stacked body.

Step (3) Lamination Process

The stacked body obtained in step (2) is subjected to lamination in a single-sided heating laminator at 140° C. for 600 s. The tin layer of the solder ribbon is melted and metallized with the busbar to form an ohmic contact. A front filler layer and a back filler layer are respectively formed on front and back sides of the stacked body, so as to complete the packaging of the front glass sheet and the back polymer sheet to obtain the PV module. A frame is arranged around the perimeter of the PV module, and a junction box is arranged on the back polymer sheet, so as to arrive at the final product.

In some embodiments, when heating the PVD film using the infrared lamp in a non-contact long-distance manner, the heating power is preferably 150-170 W. The heating time decreases with the increasing of the heating power, but it should be greater than or equal to 1s. When the heating time is lower than 1s, the PVD film is not easy to adhere to the crystalline silicon solar cell. When the heating power exceeds 170 W, the PVD film will quickly shrink and not easy to bond the solder ribbon to the crystalline silicon solar cell.

Embodiment 4

Provided is a method for preparing a PV module, which is applied to a solar cell with a positive electrode located on a front side of a crystalline silicon solar cell and a negative electrode located on a back side of the crystalline silicon solar cell. The method includes the following steps.

Step (1) Bonding Process

Figure 9:
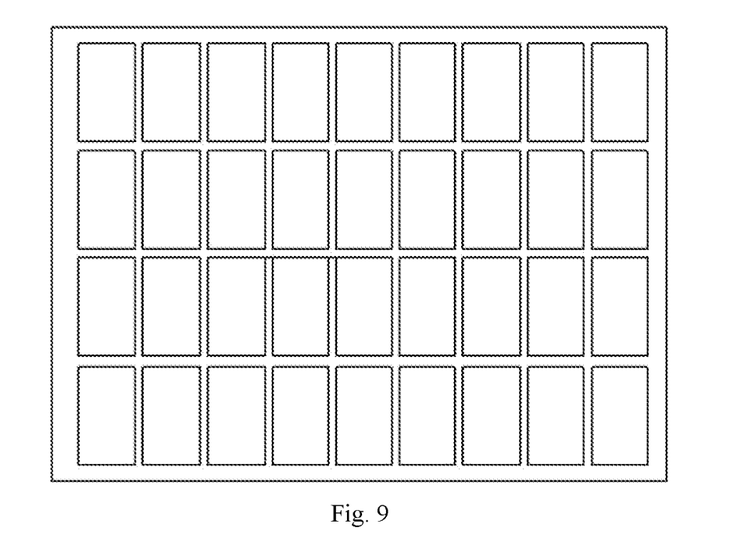
FIG. 9 schematically shows a polyvinyl butyral (PVB) net introduced to a solar cell array in step (S1) according to Embodiment 4 of the present disclosure.

A solder ribbon is successively laid on two primary grid lines on front and back sides of a crystalline silicon solar cell. Then the front side and the back side of the crystalline silicon solar cell are each covered with an isotropic homogeneous thermoplastic polyurethane (TPU) film having a thickness of 0.1 mm. A heating device directly contacts with the TPU film for heating to bond the solder ribbon to the solar cell at 105° C. for 3 s, so as to obtain a solar cell module. 14 solar cell modules are prepared and sequentially arranged in a straight line. The primary grid line on the front side of the former solar cell module is connected to the primary grid line on the back side of the latter solar cell module through a solder ribbon. In this way, the 14 solar cell modules are connected in series to form a solar cell string. Five solar cell strings are prepared and connected in parallel through busbars to form a solar cell array. The front and back sides of the solar cell array are each covered with an isotropic homogeneous PVB net having a thickness of 0.5 mm to cover the exposed solder ribbon and busbars and fill the gaps between the solar cell modules, as shown in FIG. 9.

Step (2) Stacking Process

A front glass sheet is laid on the front side of the solar cell array, and a back polymer sheet is laid on the back side of the solar cell array, so as to form a stacked body.

Step (3) Lamination Process

The stacked body obtained in step (2) is subjected to lamination in a double-sided heating laminator at 160° C. for 600 s. The tin layer of the solder ribbon is melted and metallized with the grid line to form an ohmic contact. A front filler layer and a back filler layer are respectively formed on front and back sides of the stacked body, so as to complete the packaging of the front glass sheet and the back polymer sheet to obtain the PV module. A frame is arranged around the perimeter of the PV module, and a junction box is arranged on the back polymer sheet, so as to give the final product.

In some embodiments, the TPU film may be heated with an infrared lamp in a non-contact long-distance manner. The distance between the infrared lamp and the TPU film is about 20 mm. The heating power of the infrared lamp is preferably 130-140 W. The heating time can be reduced when the heating power is larger. When the heating power is 140 W, the heating time is preferably 1 s. At this time, no bubbles between the TPU file and the crystalline silicon solar cell.

Embodiment 5

Provided is a method for preparing a PV module, which is applied to a solar cell with a positive electrode located on a front side of a crystalline silicon solar cell and a negative electrode located on a back side of the crystalline silicon solar cell. The method provided in this embodiment is different from the method of Embodiment 1 merely in the thickness of the PVB film used in step (1). In this embodiment, the thickness of the PVB film is 0.2 mm.

Embodiment 6

Provided is a method for preparing a PV module, which is applied to a solar cell with a positive electrode located on a front side of a crystalline silicon solar cell and a negative electrode located on a back side of the crystalline silicon solar cell. The method provided in this embodiment is different from the method of Embodiment 1 merely in the thickness of the PVB film used in step (1). In this embodiment, the thickness of the PVB film is 0.8 mm.

Embodiment 7

Provided is a method for preparing a PV module, which is applied to a solar cell with a positive electrode located on a front side of a crystalline silicon solar cell and a negative electrode located on a back side of the crystalline silicon solar cell. The method provided in this embodiment is different from the method of Embodiment 1 merely in the bonding temperature of the PVB film in step (1). In this embodiment, the bonding temperature is 55° C.

Embodiment 8

Provided is a method for preparing a PV module, which is applied to a solar cell with a positive electrode located on a front side of a crystalline silicon solar cell and a negative electrode located on a back side of the crystalline silicon solar cell. The method provided in this embodiment is different from the method of Embodiment 1 merely in the bonding temperature of the PVB film in step (1). In this embodiment, the bonding temperature is 145° C.

Comparative Embodiment 1

Provided is a method for preparing a PV module, which is applied to a solar cell with a positive electrode located on a front side of a crystalline silicon solar cell and a negative electrode located on a back side of the crystalline silicon solar cell. The method includes the following steps.

Step (1) Bonding Process

A solder ribbon is successively laid on two primary grid lines on front and back sides of a crystalline silicon solar cell. Then the front side and the back side of the crystalline silicon solar cell are each covered with an isotropic homogeneous thermoplastic PVB film having a thickness of 0.25 mm. A heating device directly contacts with the PVB film for heating to bond the solder ribbon to the solar cell at 70° C. for 3 s, so as to obtain a solar cell module. 15 solar cell modules are prepared and sequentially arranged in a straight line. The primary grid line on the front side of the former solar cell module is connected to the primary grid line on the back side of the latter solar cell module through a solder ribbon, and adjacent two solar cell modules are spaced apart. In this way, the 15 solar cell modules are sequentially connected in series to form a solar cell string. Four solar cell strings are prepared and connected in parallel through busbars to form a solar cell array. The front and back sides of the solar cell array are each covered with an isotropic homogeneous TPU film having a thickness of 0.25 mm.

Step (2) Stacking Process

A front glass sheet is laid on the front side of the solar cell array, and a back polymer sheet is laid on the back side of the solar cell array, so as to form a stacked body.

Step (3) Lamination Process

The stacked body obtained in step (2) is subjected to lamination in a double-sided heating laminator at 160° C. for 360 s. The tin layer of the solder ribbon is melted and metallized with the grid line to form an ohmic contact. A front filler layer and a back filler layer are respectively formed on front and back sides of the stacked body, so as to complete the packaging of the front glass sheet and the back polymer sheet to obtain the PV module, where the front filler layer and the back filler layer both have a thickness of about 0.35 mm. A frame is arranged around the perimeter of the PV module, and a junction box is arranged on the back polymer sheet, so as to give the final product.

Comparative Embodiment 2

Provided is a method for preparing a PV module, which is applied to a solar cell with a positive electrode located on a front side of a crystalline silicon solar cell and a negative electrode located on a back side of the crystalline silicon solar cell. The method includes the following steps.

Step (1) Bonding Process

A solder ribbon is successively laid on two primary grid lines on front and back sides of a crystalline silicon solar cell. Then the front side and the back side of the crystalline silicon solar cell are each covered with a film consisting of an ethylene vinyl acetate (EVA) layer and a PVB layer, where the film has a thickness of 0.5 mm, the EVA layer directly contacts with the solder ribbon and the crystalline silicon solar cell, the EVA layer has a thickness of 0.25 mm, and the PVB layer has a thickness of 0.25 mm. A heating device directly contacts with the film for heating to bond the solder ribbon to the solar cell at 70° C. for 3 s, so as to obtain a solar cell module. 15 solar cell modules are prepared and sequentially arranged in a straight line. The primary grid line on the front side of the former solar cell module is connected to the primary grid line on the back side of the latter solar cell module through a solder ribbon, and adjacent two solar cell modules are spaced apart. In this way, the 15 solar cell modules are sequentially connected in series to form a solar cell string. Four solar cell strings are prepared and connected in parallel through busbars to form a solar cell array.

Step (2) Stacking Process

A front glass sheet is laid on the front side of the solar cell array, and a back polymer sheet is laid on the back side of the solar cell array, so as to form a stacked body.

Step (3) Lamination Process

The stacked body obtained in step (2) is subjected to lamination in a double-sided heating laminator at 160° C. for 360 s. The tin layer of the solder ribbon is melted and metallized with the grid line to form an ohmic contact. A front filler layer and a back filler layer are respectively formed on front and back sides of the stacked body, so as to complete the packaging of the front glass sheet and the back polymer sheet to obtain the PV module, where the front filler layer and the back filler layer both have a thickness of about 0.35 mm. A frame is arranged around the perimeter of the PV module, and a junction box is arranged on the back polymer sheet, so as to give the final product.

In Embodiments 1-4, the bonding between the solder ribbon and the crystalline silicon solar cell is good, without detachment and insulation problems the solder ribbon. No obvious bubbles and voids are observed in the filling layer. The front sealing plate and the back sealing plate are firmly encapsulated, and the obtained PV modules have excellent factory qualities. Compared with Embodiment 1, the thickness of the PVB film is lower in Embodiment 5 and higher in Embodiment 6, and is not in the preferable rang of 0.4-0.6 mm. The amount of PVB in Embodiment 5 is too small to fully fill the gaps in the solar cell array, while the amount of PVB in Embodiment 6 is too large and the excess polymeric material overflows, making clean-up tedious and increasing costs. The heating temperatures in Embodiments 7 and 8 are not in the preferable range of 70-130° C. The heating temperature in Embodiment 7 is too low such that the bonding between the PVB and the crystalline silicon solar cell is unable, and the solder ribbon tends to move. While the heating temperature in Embodiment 8 is too high, which makes the PVB more flowable. Besides, as the temperature continues to increase, the PVB will enter the space between the solder ribbon and the crystalline silicon solar cell, causing insulation. In step (1) of Comparative Embodiment 1, a second film different from the PVB film is additionally provided, while a film composed of two different materials is used in step (1) of Comparative Embodiment 2. Although the total thickness of the polymeric material in Comparative Embodiment 1 and Comparative Embodiment 2 is the same as that in Embodiment 1, two different materials are hard to fuse with each other during the lamination process, thus affecting the light transmission of the PV module.

As can be seen from the above description, the method for fabricating the PV module described herein achieves the bonding of the solder ribbon and the encapsulation of the PV module by merely using a thin film. It ensures good bonding and stability without affecting the electrical connection performance between the solder ribbon and the crystalline silicon solar cell. Moreover, it is not required to distinguish the front and back sides of the bonding film when used, which simplifies the process, and reduces the material consumption and costs, and will not affect the overall light transmission of the PV module.

The detailed structural features of the present disclosure are described through the above-mentioned embodiments, but the present disclosure is not limited by such detailed structural features, that is, the implementation of the present disclosure does not necessarily rely on these structural features. It should be understood that any improvements, replacements and modifications made by one of ordinary skill in the art to the present disclosure without departing from the spirit of the disclosure shall fall within the scope of the present disclosure defined by the appended claims.

Described above are merely preferred embodiments of the present disclosure, which should not be construed as limitations to the present disclosure. Simple variants of the technical solutions of the present disclosure can be made within the technical conception of the present disclosure, and these variants shall fall within the scope of the present disclosure.

It is also to be noted that the various specific technical features described in the above embodiments can be combined in any suitable way without contradiction. For the sake of simplified description, various possible combinations will be not described herein.

Furthermore, different embodiments of the present disclosure can also be combined. These combinations shall be considered as disclosed in the present disclosure as long as they do not contradict the idea and concept of the present disclosure.

What is claimed is:

1. A method for fabricating a photovoltaic (PV) module, comprising:
   (S1) placing a solder ribbon on at least one side of a crystalline silicon solar cell;
   covering a first polymer material on the at least side of the crystalline silicon solar cell where the solder ribbon is placed, followed by heating at a first temperature to bond the polymer material to the crystalline silicon solar cell, so as to attach the solder ribbon to the crystalline silicon solar cell to form a solar cell module; and
   successively or simultaneously preparing a plurality of solar cell modules, and connecting the plurality of solar cell modules in series by the solder ribbon to form a solar cell string; connecting a plurality of solar cell strings in series and/or in parallel through a busbar to form a solar cell array; and introducing a second polymer material to fill gaps in the solar cell array, wherein the second polymer material is the same as the first polymer material;
   wherein the first polymer material is an isotropic homogeneous film composed of a single substance; a thickness of the first polymer material on a side of the solar cell module is 0.02-0.25 mm; a total thickness of the first polymer material and the second polymer material on the same side of the solar cell array is 0.4-0.6 mm; and
   the first temperature is 70-130° C. excluding 130° C., and the heating is performed for 1-5 s;
   (S2) laying a first sealing plate on a first side of the solar cell array, and laying a second sealing plate on a second side of the solar cell array to form a stacked body;
   (S3) subjecting the stacked body obtained in step (S2) to lamination at a second temperature to enable a soldering layer of the solder ribbon to be melted and soldered with a grid line of the crystalline silicon solar cell to form an ohmic contact, and allow softening of the first polymer material and the second polymer material to form a filler layer to package the solar cell array, thereby producing the PV module;
   wherein a softening point of the first polymer material and the second polymer material is no more than the first temperature; the first temperature is less than a melting point of the soldering layer of the solder ribbon, and the melting point of the soldering layer of the solder ribbon is less than or equal to the second temperature;
   and the second temperature is 130-170° C.

2. The method of claim 1, wherein the step (S1) further comprises:
   during the heating at the first temperature, applying a force towards the crystalline silicon solar cell to the first polymer material; and
   after the heating, cooling the first polymer material by air blowing to complete bonding between the first polymer material and the crystalline silicon solar cell.

3. The method of claim 1, wherein the second polymer material is introduced into the solar cell array through a step of:
   filling the gaps in the solar cell array with the second polymer material in a ribbon shape, a block shape, or a net shape; and/or
   covering an outer surface of the solar cell array with a piece of the second polymer material.

4. The method of claim 1, wherein in step (S1), the first polymer material is selected from the group consisting of polyvinyl butyral (PVB), ethylene vinyl acetate (EVA), polyolefin elastomer (POE), polyformaldehyde (POM), polyvinylidene (PVD), thermoplastic polyolefin (TPO), thermoplastic polyurethane (TPU), and polyamide (PA).

5. APV module fabricated by using the method of claim 1.

6. A method for fabricating a PV module, comprising:
   (S1) placing a solder ribbon on at least one side of a crystalline silicon solar cell;
   covering a first polymer material on the at least one side of the crystalline silicon solar cell where the solder ribbon is placed, followed by heating at a first temperature to bond the polymer material to the crystalline silicon solar cell, so as to attach the solder ribbon to the crystalline silicon solar cell to form a solar cell module; and
   successively or simultaneously preparing a plurality of solar cell modules, and connecting the plurality of solar cell modules in series by the solder ribbon to form a solar cell string; connecting a plurality of solar cell strings in series and/or in parallel through a busbar to form a solar cell array; and introducing a second polymer material to fill gaps in the solar cell array, wherein the second polymer material is the same as the first polymer material;
   wherein the first polymer material is an isotropic homogeneous film composed of a single substance; a thickness of the first polymer material on a side of the solar cell module is 0.02-0.25 mm; a total thickness of the first polymer material and the second polymer material on the same side of the solar cell array is 0.15-0.6 mm; and
   the first temperature is 70-130° C. excluding 130° C., and the heating is performed for 1-5 s;
   (S2) laying a first sealing plate on a first side of the solar cell array, and laying a second sealing plate on a second side of the solar cell array to form a stacked body;
   (S3) subjecting the stacked body obtained in step (S2) to lamination at a second temperature to enable a soldering layer of the solder ribbon to be melted and soldered with a grid line of the crystalline silicon solar cell to form an ohmic contact, and allow softening of the first polymer material and the second polymer material to form a filler layer to package the solar cell array, thereby producing the PV module;
   wherein a softening point of the first polymer material and the second polymer material is no more than the first temperature; the first temperature is less than a melting point of the soldering layer of the solder ribbon, and the melting point of the soldering layer of the solder ribbon is less than or equal to the second temperature; and the second temperature is 130-170° C.

* * * * *